(12) United States Patent
Chen et al.

(10) Patent No.: US 6,937,476 B1
(45) Date of Patent: Aug. 30, 2005

(54) MOUNTING APPARATUS FOR MOTHERBOARD

(75) Inventors: Yun-Lung Chen, Tu-cheng (TW); Zhong-Yi Sheng, Shenzhen (CN)

(73) Assignee: Hon Hai Precision Industry Co., Ltd., Taiwan (TW)

( * ) Notice: Subject to any disclaimer, the term of this patent is extended or adjusted under 35 U.S.C. 154(b) by 0 days.

(21) Appl. No.: 11/019,904

(22) Filed: Dec. 21, 2004

(30) Foreign Application Priority Data

Feb. 6, 2004 (TW) .............................. 93201657 U

(51) Int. Cl.[7] .......................... H05K 5/00; H05K 5/04; H05K 5/06
(52) U.S. Cl. ..................... 361/756; 361/732; 361/740; 361/741; 361/747; 361/759; 361/801; 361/802
(58) Field of Search ............................... 361/683–686, 361/725–728, 732, 735, 740, 741, 742, 747, 361/748, 756, 758, 759, 790, 801, 802, 807; 211/41.12, 41.17; 312/223.1, 233.2; 24/289

(56) References Cited

U.S. PATENT DOCUMENTS

| | | | |
|---|---|---|---|
| 4,901,204 A * | 2/1990 | Hayashi ..................... 361/807 |
| 5,754,396 A | 5/1998 | Felcman et al. ............. 361/683 |
| 5,801,928 A * | 9/1998 | Burstedt et al. ............. 361/801 |
| 6,385,051 B1 * | 5/2002 | Perez et al. .................. 361/759 |
| 6,470,555 B2 | 10/2002 | Boe ............................ 29/450 |
| 6,771,516 B1 * | 8/2004 | Leman et al. ............... 361/825 |
| 2004/0125575 A1 * | 7/2004 | Chen et al. .................. 361/759 |

* cited by examiner

Primary Examiner—Phuong T. Vu
(74) Attorney, Agent, or Firm—Morris Manning & Martin; Tim Tingkang Xia, Esq.

(57) ABSTRACT

A mounting apparatus for mounting a motherboard (10) includes a base (80), a supporting tray (20) secured on a bottom of the motherboard, a housing (40) attached on the base with a position hole (46) defined therein, a turntable (50) pivotally mounted on the housing, and a connecting member (60) pivotally connecting the supporting tray and the turntable. The connecting member downwardly forms a cylindrical protrusion (64). A plurality of mounting holes (34) is defined in the supporting tray and each comprises an accommodating hole (31) and a retaining hole (32). A plurality of standoffs (82) is formed on the base. After head portions of the standoffs are received in corresponding accommodating holes, the turntable is rotated to drive the supporting tray. The motherboard is attached to the base when the neck portions are received in corresponding retaining holes, and the cylindrical protrusion engages in the position hole.

19 Claims, 5 Drawing Sheets

MOUNTING APPARATUS FOR MOTHERBOARD

BACKGROUND OF THE INVENTION

1. Field of the Invention

The present invention relates to mounting apparatuses, and particularly to a mounting apparatus that readily attaches a motherboard in a computer chassis.

2. Description of the Related Art

Conventional methods of installing a circuit board, such as a motherboard, to a computer chassis use small fasteners such as screws or rivets. When using such objects to mount a motherboard to a computer chassis, an appropriate tool must be used, e.g., a screwdriver or riveter. Using tools to connect these components may damage the motherboard, if the tool slips during the assembly process. Additionally, the process of mounting the motherboard to the chassis may require working in tight space or require the use of smaller hardware and tools, which can make the assembly process difficult. Thus, these motherboard installation methods are unduly laborious and time-consuming.

An improvement in the mounting of a motherboard in a computer chassis is illustrated and described in U.S. Pat. No. 6,470,555. In this patent, a method of removably mounting a motherboard is disclosed. The method comprises positioning a first fastener of a mounting device adjacent to a mounting slot in the chassis, inserting the first fastener of the mounting device through the mounting slot in the chassis, releasing the mounting device so that the first fastener clamps onto the chassis through the mounting slot, positioning a second fastener of the mounting device adjacent a mounting hole on the motherboard, and inserting the second fastener of the mounting device into the mounting hole until the second fastener clasps the motherboard through the mounting hole.

However, the motherboard is directly assembled to and disassembled from the chassis when using the above method. The operating space for mounting the motherboard is limited, so components on the motherboard or adjoining the motherboard can be damaged.

Thus an improved mounting apparatus for motherboards that overcomes the above-mentioned problems is desired.

SUMMARY OF THE INVENTION

Accordingly, an object of the present invention is to provide a mounting apparatus which readily and conveniently secures a planar member, for example, a motherboard, to the computer base and allows ready detachment therefrom.

To achieve the above-mentioned object, A mounting apparatus for mounting a motherboard includes a base, a pair of locking members secured on the base, a supporting tray secured on a bottom of the motherboard, a housing attached on the base with a position hole defined therein, a turntable pivotally mounted on the housing, and a connecting member pivotally connecting the supporting tray and the turntable. The connecting member forms a cylindrical protrusion thereon. A plurality of mounting holes is defined in the supporting tray and each comprises an accommodating hole and a retaining hole. A plurality of standoffs is formed on the base and each comprises a head portion and a neck portion. After the head portions of the standoffs are received in corresponding accommodating holes, the turntable is rotated. The motherboard is attached to the base when the neck portions are received in corresponding retaining holes, and the cylindrical protrusion engaged in the position hole.

Other objects, advantages and novel features of the present invention will be drawn from the following detailed description of a preferred embodiment of the present invention with attached drawings, in which:

DETAILED DESCRIPTION OF THE INVENTION

Figure 1:
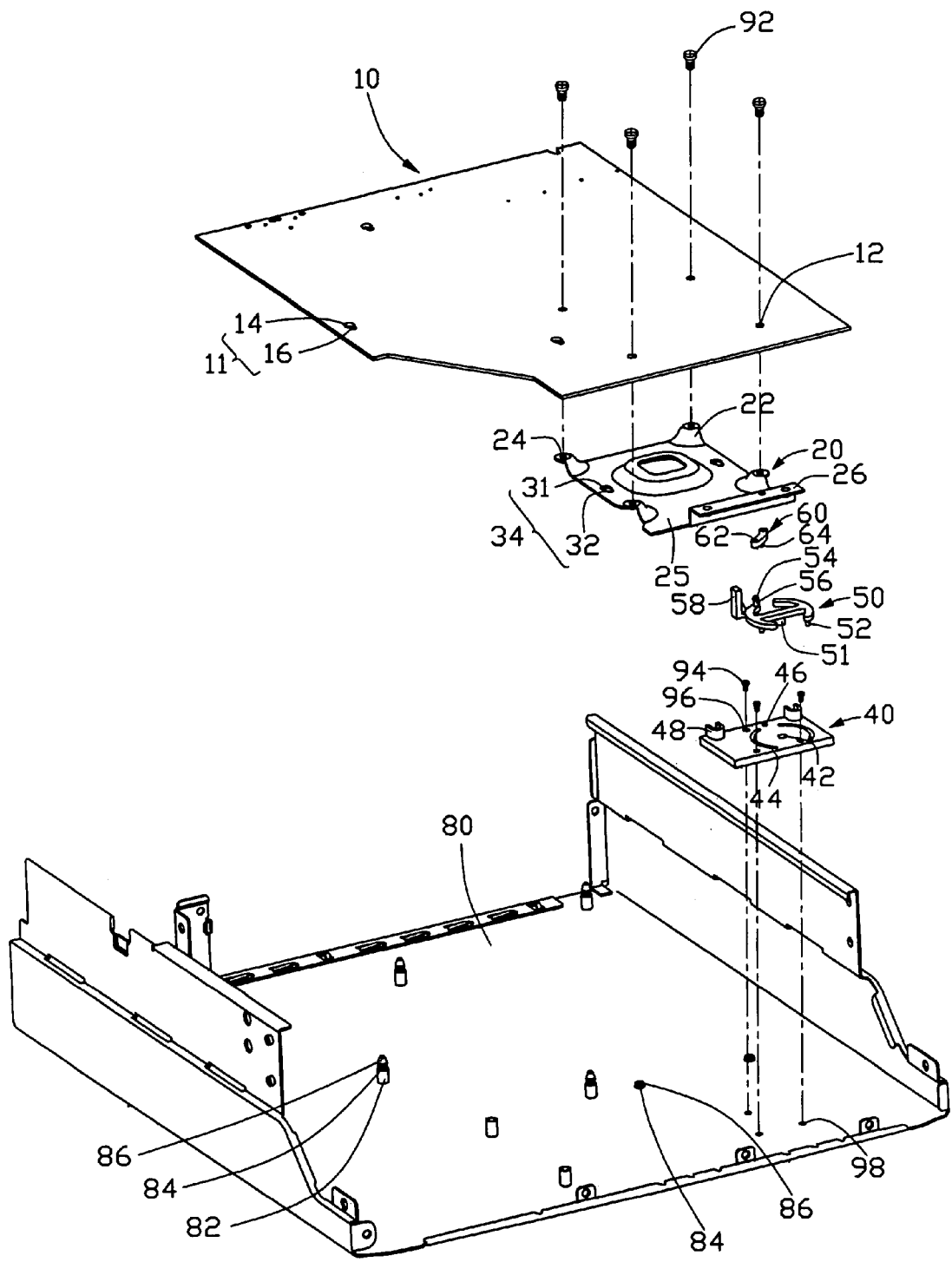
FIG. 1 is an exploded, isometric view of a mounting apparatus in accordance with a preferred embodiment of the present invention together with a motherboard.
Figure 2:
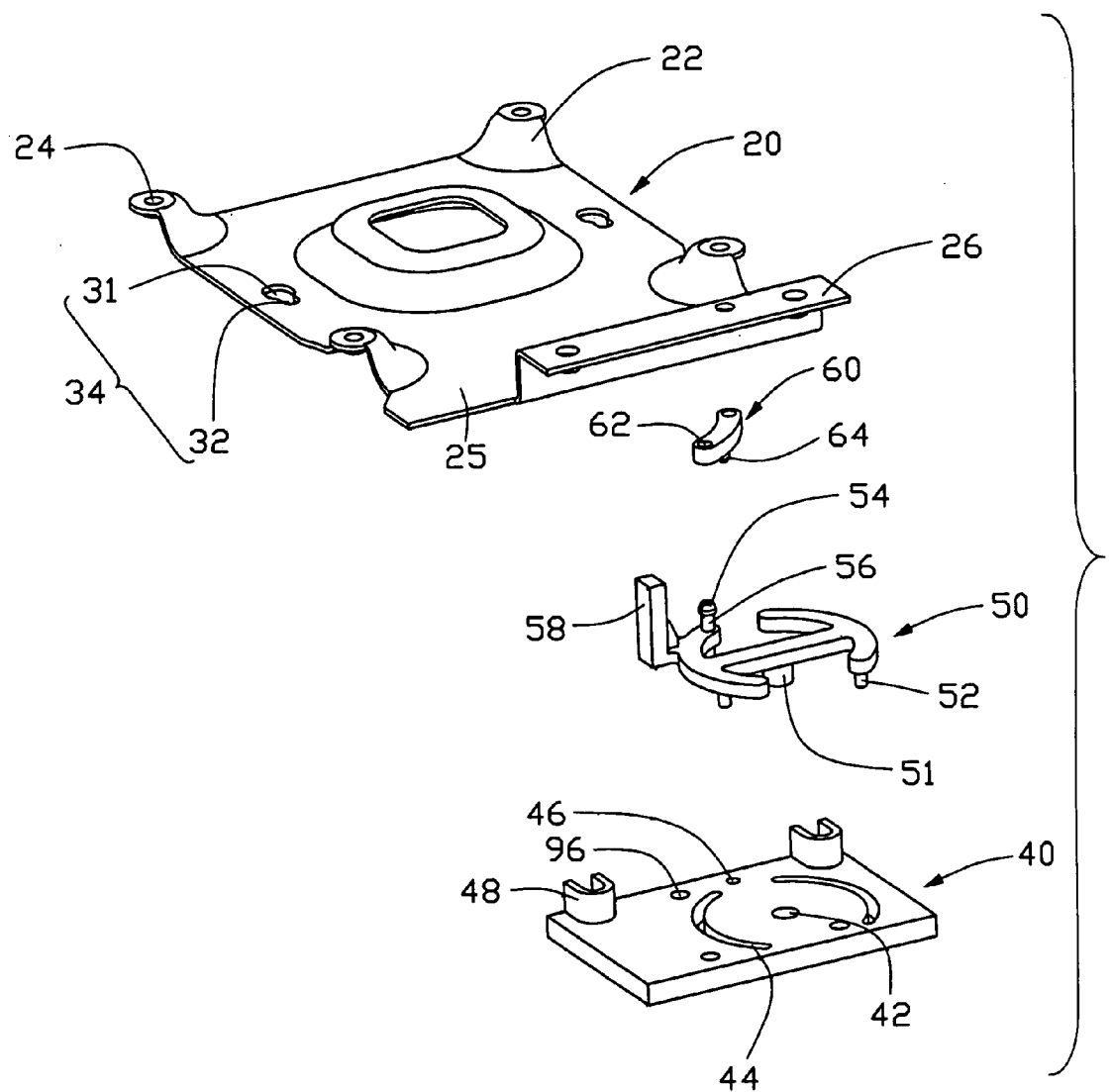
FIG. 2 is an exploded, isometric view of a mounting apparatus of FIG. 1.
Figure 3:
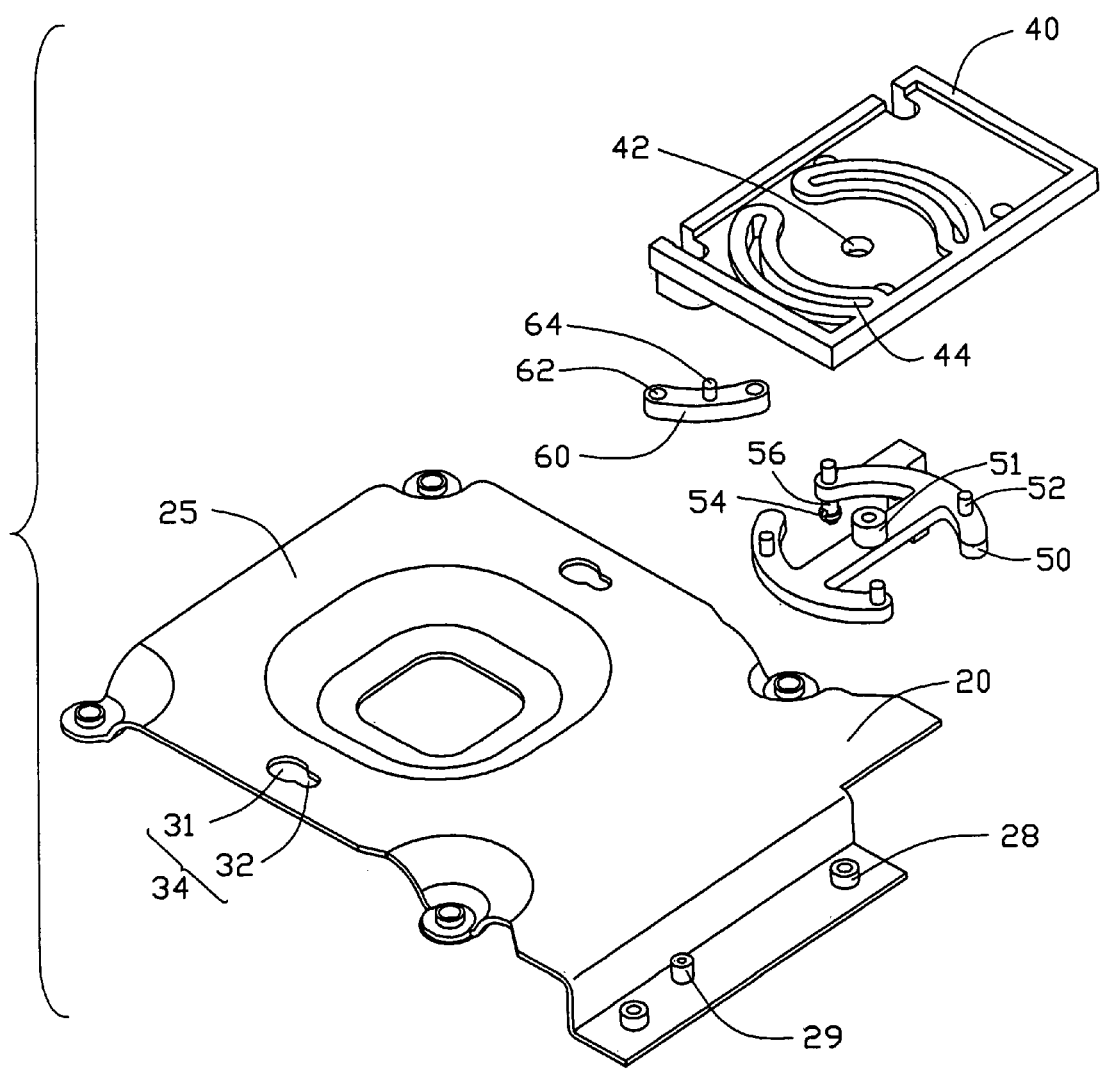
FIG. 3 is similar to FIG. 2, but viewed from another direction.

Referring to FIGS. 1 to 3, a mounting apparatus in accordance with the preferred embodiment of the present invention is used to assemble and disassemble a first planar member such as a motherboard 10 on a second planar member such as a base 80 of a chassis of an electronic device like a computer. The mounting apparatus comprises a tray-like supporting member 20, a rectangular housing 40, a rotating means like a turntable 50, a connecting member 60, and the base 80.

The motherboard 10 defines a plurality of first mounting holes 11 and four fixing holes 12 therein. Each mounting hole 11 is generally calabash-shaped and comprises a first accommodating hole 14 and a first retaining hole 16.

The supporting tray 20 is removably attached to the base 80 and secured on a bottom surface of the motherboard 10. The supporting tray 20 comprises a rectangular planar panel 25, and a L-shaped hem 26 is formed upwardly from the rectangular planar panel 25. Two pairs of platforms 22 are symmetrically projected from the rectangular planar panel 25. A fixing hole 24 is defined in each platform 22 corresponding to the fixing hole 12 of the motherboard 10. Thereby, four screws 92 secure the supporting tray 20 to the motherboard 10. Two posts 28 are symmetrically projected from a bottom of the hem 26. A position tab 29 is formed on the bottom of the hem 26. A plurality of second mounting holes 34 is defined in the supporting tray 20. Each second mounting hole 34 is generally calabash-shaped and comprises a second accommodating hole 31 and a second retaining hole 32.

The rectangular housing 40 is made of plastic material, and is mounted on the base 80. The rectangular housing 40 defines a bore 42 and a pair of sliding slots 44 respectively around the bore 42. The width of the slots 44 is lessened from one end to the other end. A position hole 46 is defined in the rectangular housing 40 for the position tab 29 engaging therein. The rectangular housing 40 has two U-shaped protuberance 48 formed thereon corresponding to the posts 28 of the supporting tray 20. A plurality of through apertures 96 is defined in the rectangular housing 40.

The turntable 50 is pivotally mounted on the rectangular housing 40. An axis 51 is formed on the bottom of the turntable 50 corresponding to the bore 42 of the rectangular housing 40. Four actuating posts 52 extend from the bottom of the turntable 50 for movably received in the corresponding sliding slots 44 of the rectangular housing 40. The actuating posts 52 abut against the sidewalls of the sliding slots 44. A shaft 56 extends upwardly from the turntable 50. The shaft 56 forms an enlarged top portion with a longitudinal gap 54 defined therein. A handle 58 extends upwardly from the turntable 50 for facilitating manual operation.

The connecting member 60 is pivotably mounted on the turntable 50, and comprises two through holes 62 in opposite end portions of the connecting member 60. The shaft 56 is engaged in one of the through holes 62, the position tab 29 of the supporting tray 20 is engaged in the other through hole 62. A cylindrical protrusion 64 is formed downwardly from the connecting member 60 corresponding to the position hole 46 of the rectangular housing 40.

A plurality of standoffs 82 is formed on the base 80 to cooperate with the first and second mounting holes 11, 34. Each standoff 82 comprises a head portion 86 and a neck portion 84. A diameter of the head portion 86 is smaller than that of the first and second accommodating holes 14, 31 of the mounting holes 11, 34, and is greater than that of the first and second retaining holes 16, 32 of the mounting holes 11, 34. A diameter of the neck portion 84 is smaller than that of the first and second retaining holes 16, 32 of the mounting holes 11, 34. A plurality of screw holes 98 is defined in the base 80 for attaching the rectangular housing 40.

Figure 4:
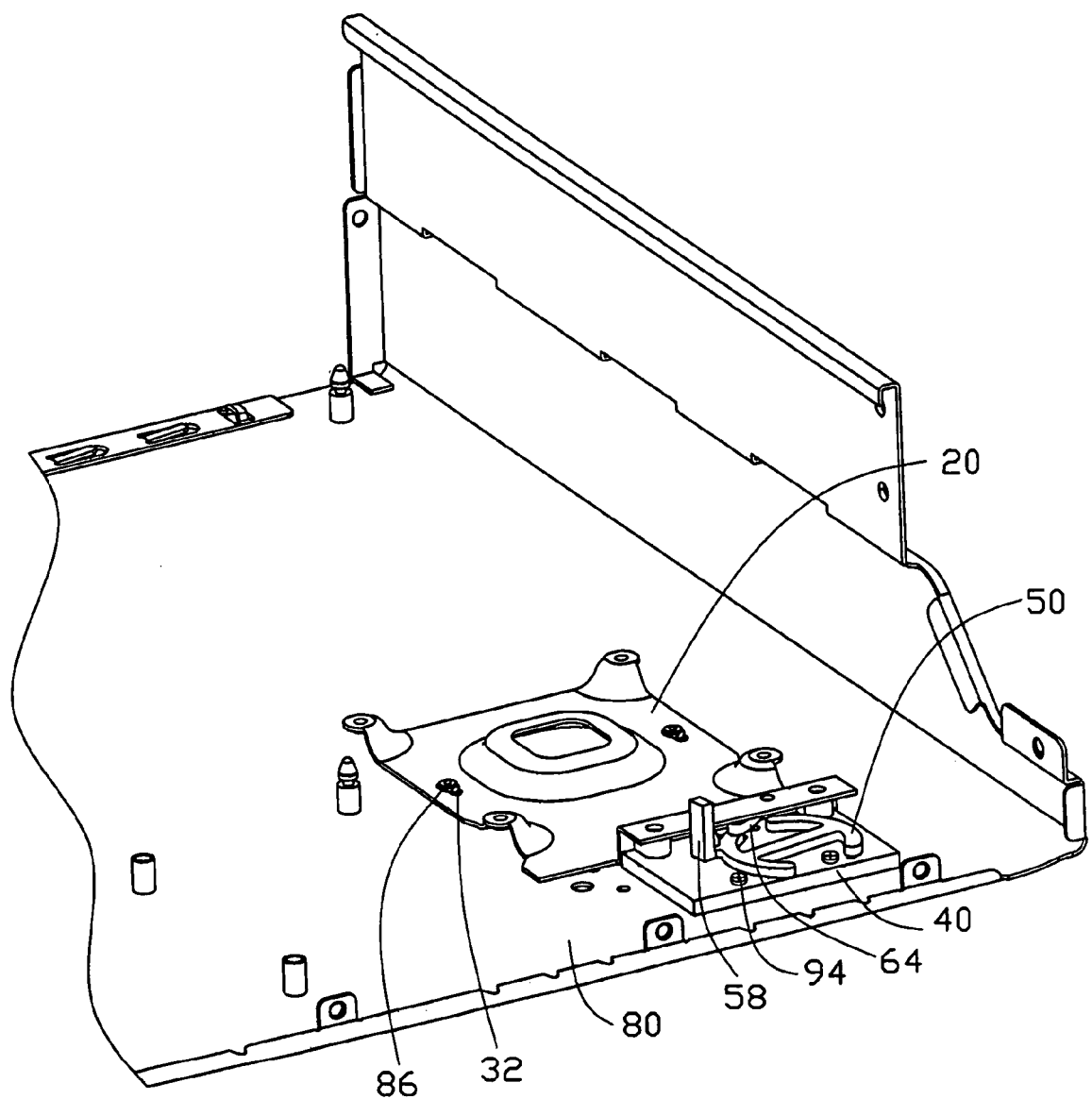
FIG. 4 is an assembled view of the mounting apparatus of FIG. 1.
Figure 5:
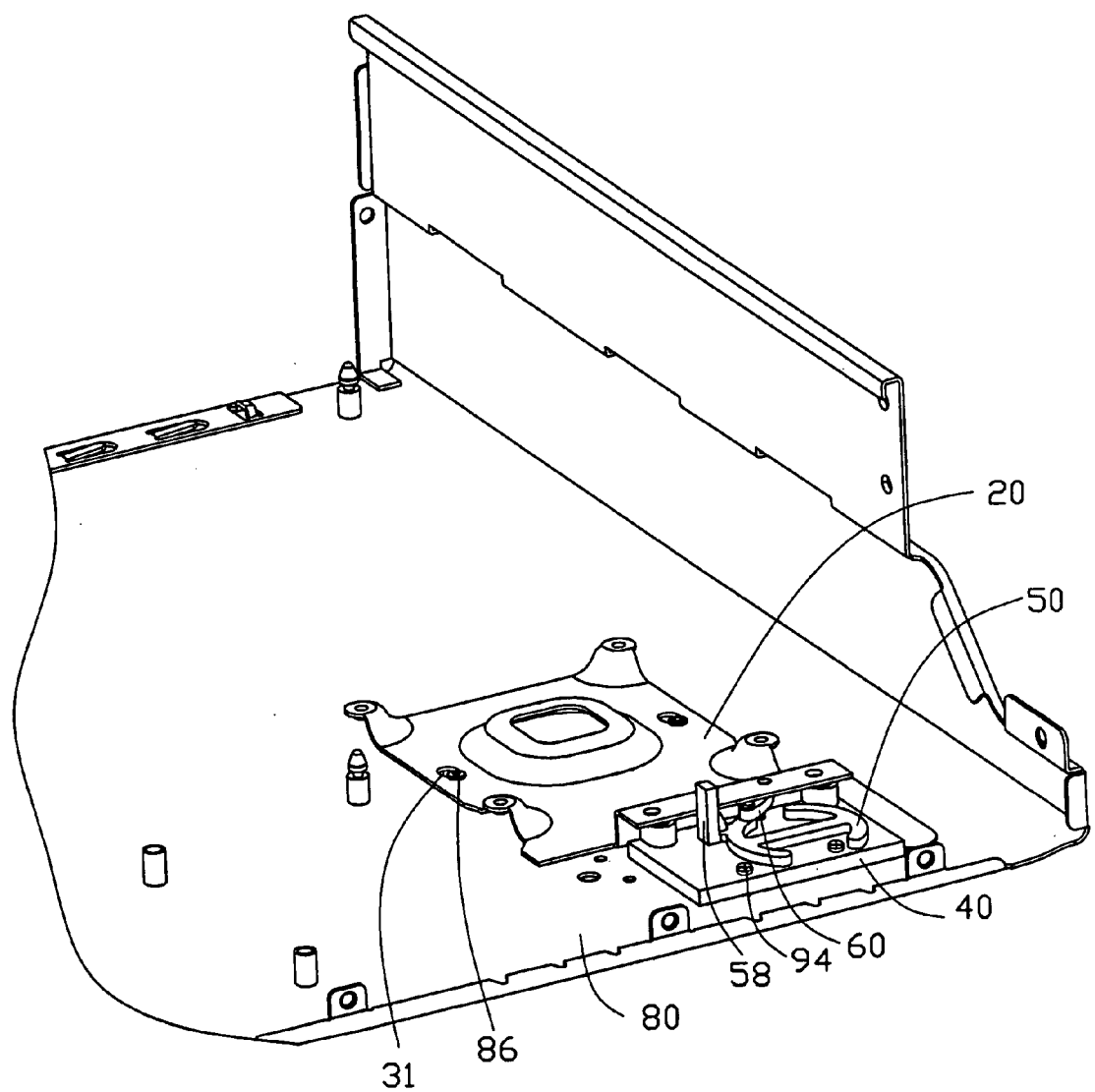
FIG. 5 is a fully assembled view of FIG. 1.

Referring also to FIGS. 4 to 6, in assembly, the rectangular housing 40, the turntable 50 and the connecting member 60 are assembled together and secured on the base 10. Then the supporting tray 20 with the motherboard 10 secured thereon is put on the base 80. The steps of assembly and disassembly will be described in detail below.

In assembly, the rectangular housing 40 is firstly attached on the base 80. Four screws 94 extend through the through apertures 96 and engage in the screw holes 98. After that, the axis 51 is in alignment with the bore 42 with the actuating posts 52 placed in the sliding slots 44, then the turntable 50 is pressed down to fasten the turntable 50 to the rectangular housing 40. The connecting member 60 is connected with the shaft 54, with the shaft 54 extending into one of the through holes 62 of the connecting member 60. The top portion 56 of the shaft 54 is deformably passed through the through holes 62. Then the top portion rebounds, so that the connecting member 60 is mounted on the turntable 50, and can rotate about the turntable 50.

Then the motherboard 10 is secured on the supporting tray 20 with a plurality of screws 92 penetrating the fixing holes 12 of the motherboard 10 and locked in the fixing holes 24 of the supporting tray 20.

After that, the supporting tray 20 with the motherboard 10 mounted thereon is put on the base 80 with the standoffs 82 extending through the first and second accommodating holes 14, 31 of the mounting holes 11, 34, respectively. Then the position tab 29 is inserted into the other through hole 62 of the connecting member 60, and the two posts 28 are received in the openings of the U-shaped protuberance 48 of the rectangular housing 40.

The handle 58 is rotated towards outer space of the base 80, with the connecting member 60 rotated together. The end portion of the connecting member 60 pivots about the shaft 54 of the turntable 50, and the other end portion of the connecting member 60 moves along the direction which is defined by the mounting holes 34 and the U-shaped protuberance 48. Continually rotating the handle 58, the supporting tray 20 is pulled by the connecting member 60 to gently move to the inner space of the base 80. The supporting tray 20 stops when the neck portions 86 of the standoffs 82 substantially engaged in corresponding first and second retaining holes 16, 32 of the mounting holes 11, 34 of the motherboard 10 and the supporting tray 20. At the time, the cylindrical protrusion 64 of the connecting member 60 is engaged in the position hole 46 of the rectangular housing 40, for positioning the tray 20 to maintain its position state. The width of the sliding slots 44 is widened from an original width to an extended width by the actuating posts 52 sliding in the sliding slots 44 and the width of the sliding slots 44 returns to the original width when the actuating posts 52 slide away, so the sliding slots 44 can also maintain the supporting tray 20 in the position state.

In disassembly, the handle 58 is rotated towards an inner space of the base 80. As a result, the connecting member 60 moves with the turntable 50. The cylindrical protrusion 64 is pulled out from the position hole 46. The actuating posts 52 abut against the sidewalls of the sliding slots 44. Continually rotating the handle 58, the supporting tray 20 is driven by the connecting member 60 to move towards the outer space of the base 80. The supporting tray 20 is stopped when the first and second accommodating holes 14, 31 have the standoffs 82 received therein. At the time, an operator lift the supporting tray 20 to disassemble the motherboard 10 from the base 80.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A mounting apparatus for mounting a planar member defining a plurality of first mounting holes, the first mounting holes each comprising a first accommodating hole and a first retaining hole, the mounting apparatus comprising:
   a base with a plurality of first standoffs formed thereon, the first standoffs adapted to be received in corresponding first mounting holes respectively and each comprising a first head portion and a first neck portion;
   a supporting tray adapted for being secured to a bottom surface of the planar member, the supporting tray having a hem bent upwardly from an end thereof, a position tab formed on the bottom of the hem;
   a housing attached on the base with a position hole defined therein;
   a turntable pivotally mounted on the housing with a shaft formed thereon; and
   a connecting member pivotally connecting the position tab of the supporting tray and the shaft of the turntable, and comprising a cylindrical protrusion formed downwardly thereon;
   wherein after the first head portions of the first standoffs on the base are received in corresponding first accommodating holes of the planar member, the turntable is rotated to urge the planar member to have the first neck portions of the first standoffs received in the first retaining holes, and the cylindrical protrusion is moved into the position hole.

2. The mounting apparatus as described in claim 1, wherein a plurality of first locking holes are defined in the planar member, and a plurality of second locking holes are defined in the supporting tray correspondingly for screws engaging in the locking holes to secure the supporting tray to the planar member.

3. The mounting apparatus as described in claim 2, wherein a plurality of platforms is symmetrically projected from the supporting tray, the second locking holes are symmetrically defined in the platforms respectively.

4. The mounting apparatus as described in claim 1, wherein two posts are symmetrically formed downwardly from the hem, and two U-shaped protuberance are formed on the housing corresponding to the posts.

5. The mounting apparatus as described in claim 1, wherein an axis is formed on the turntable, and a bore is defined in the housing for the axis pivoting therein.

6. The mounting apparatus as described in claim 1, wherein two sliding slots are defined in the housing, and a plurality of actuating posts extends from the bottom of the turntable for movably received in the corresponding sliding slots of the rectangular housing.

7. The mounting apparatus as described in claim 6, wherein the width of each sliding slot is lessened from an end to the other end.

8. The mounting apparatus as described in claim 1, wherein a plurality of second mounting holes is defined in the supporting tray and each comprises a second accommodating hole and a second retaining hole, and corresponding number of second standoffs are formed on the base, each of the second standoffs comprises a second head portion and a second neck portion.

9. The mounting apparatus as described in claim 8, wherein a diameter of the first or second head portion is smaller than that of the first or second accommodating holes respectively, and is greater than that of the first or second retaining holes, and a diameter of the first or second neck portion is smaller than that of the first or second retaining hole respectively.

10. The mounting apparatus as described in claim 1, wherein the turntable further comprises a handle formed thereon.

11. The mounting apparatus as described in claim 1, wherein the connecting member comprises two through holes for receiving the shaft and the position tab respectively.

12. A mounting apparatus for mounting a motherboard comprising:
 a base with a plurality of standoffs formed thereon, the standoffs each comprising a head portion and a neck portion;
 a supporting tray adapted for being secured to a bottom surface of the motherboard with a hem bent upwardly from a front end thereof, a position tab formed on the bottom of the hem, and a plurality of mounting holes defined in the supporting tray or the motherboard to receive the standoffs of the base, the mounting holes each comprising an accommodating hole and a retaining hole;
 a housing made of the flexible material being arranged on the base, a pair of sliding slots defined in the housing, a width of each of the sliding slots lessened from an end to the other end;
 a turntable mounted on the housing, comprising a shaft formed thereon, and at least one actuating post extending downwardly from the turntable; and
 a connecting member pivotally connecting the position tab of the supporting tray and the shaft of the turntable;
 wherein after the first head portions of the first standoffs on the base are received in corresponding first accommodating holes of the motherboard, the turntable is rotated towards an inner space of the base, the motherboard is attached to the base when the first neck portions of the first standoffs are received in corresponding first retaining holes of the supporting tray, an lessened-width end of the slots clamps said actuating post.

13. The mounting apparatus as described in claim 12, wherein an axis is formed on the turntable, and a bore is defined in the housing for the axis pivoting therein.

14. The mounting apparatus as described in claim 12, wherein a position hole defined in the housing, and the connecting member comprises a cylindrical protrusion formed downwardly thereon for engaging in the position hole.

15. The mounting apparatus as described in claim 12, wherein two posts are symmetrically formed downwardly from the hem, and two U-shaped protuberances are formed on the housing corresponding to the posts.

16. A mounting apparatus for mounting a circuit board to a chassis of an electronic device, comprising:
 a support tray securely attached to said circuit board and movable together therewith between a first position where said support tray and said circuit board are securely mounted to said chassis and a second position where said support tray and said circuit board are freely removable away from said chassis, said support tray having a hem extending therefrom beside said circuit board;
 rotating means pivotally attached to said chassis to rotate about an axis defined next to said circuit board and substantially perpendicular to said circuit board; and
 a connecting member attached to said rotating means and movable together therewith, said connecting member engagable with said hem of said support tray so as to control movement of said support tray and said circuit board between said first position and said second position due to rotation of said rotating means.

17. The mounting apparatus as described in claim 16, further comprising a housing mounted to said chassis so as to embrace said rotating means and allow said rotation of said rotating means performed thereon.

18. The mounting apparatus as described in claim 17, wherein said rotating means is a ring-like turntable with a post extending in a slot of said housing to guide said rotation of said rotating means.

19. The mounting apparatus as described in claim 17, wherein a position hole is defined in said housing to engage with a protrusion from said connecting member so as to position said connecting member and said rotating means.

* * * * *